United States Patent
Takizawa et al.

(10) Patent No.: US 7,394,326 B2
(45) Date of Patent: Jul. 1, 2008

(54) QUARTZ OSCILLATOR MANUFACTURING METHOD AND QUARTZ OSCILLATOR

(75) Inventors: Maki Takizawa, Nishitokyo (JP); Tohru Yanagisawa, Nishitokyo (JP)

(73) Assignee: Citizen Holdings Co., Ltd., Tokyo (JP)

( * ) Notice: Subject to any disclaimer, the term of this patent is extended or adjusted under 35 U.S.C. 154(b) by 189 days.

(21) Appl. No.: 10/590,719

(22) PCT Filed: Mar. 28, 2005

(86) PCT No.: PCT/JP2005/005725

§ 371 (c)(1),
(2), (4) Date: Aug. 25, 2006

(87) PCT Pub. No.: WO2005/096493

PCT Pub. Date: Oct. 13, 2005

(65) Prior Publication Data

US 2007/0176702 A1    Aug. 2, 2007

(30) Foreign Application Priority Data

Mar. 30, 2004 (JP) .............................. 2004-097472

(51) Int. Cl.
*H03B 5/30* (2006.01)
(52) U.S. Cl. ..................... 331/154; 331/156; 331/158; 73/504.12; 73/504.14; 73/504.16; 310/370
(58) Field of Classification Search ............... 310/370; 331/154, 156, 158; 73/504.12, 504.14, 504.16
See application file for complete search history.

(56) References Cited

U.S. PATENT DOCUMENTS

| 6,018,997 | A  | * | 2/2000  | Kumada et al. | .......... 73/504.16 |
| 6,587,009 | B2 | * | 7/2003  | Kitamura et al. | ............ 331/158 |
| 6,675,651 | B2 | * | 1/2004  | Yanagisawa et al. | ..... 73/504.14 |
| 6,806,797 | B2 | * | 10/2004 | Kikushima | .................. 333/200 |

FOREIGN PATENT DOCUMENTS

| JP | 2001-196891 | 7/2001 |
| JP | 2002-243451 | 8/2002 |
| JP | 2003-28645  | 1/2003 |
| JP | 2004-77453  | 3/2004 |
| JP | 2004-079869 | 3/2004 |
| JP | 2004-93158  | 3/2004 |

* cited by examiner

*Primary Examiner*—Arnold Kinkead
(74) *Attorney, Agent, or Firm*—Manabu Kanesaka (57) ABSTRACT

A method for manufacturing a quartz oscillator having a stable temperature drift characteristic attributed to the quartz oscillating piece and a quartz oscillator are disclosed.

The method comprises a quartz crystal etching step S1 of processing a quartz oscillating piece into a predetermined shape by etching, an electrode membrane forming step S2 of forming an electrode on the quartz oscillating piece, a quartz crystal mounting step S3 of mounting the quartz oscillating piece in an oscillator package, a leakage oscillation adjusting step S4 of driving the mounted quartz oscillating piece, detecting the leakage oscillation, and removing a part of the quartz oscillating piece depending on the detected leakage oscillation, and a re-etching step S6 of re-etching the quartz oscillating piece subjected to the removal.

17 Claims, 7 Drawing Sheets

QUARTZ OSCILLATOR MANUFACTURING METHOD AND QUARTZ OSCILLATOR

TECHNICAL FIELD

The present invention relates to a method for manufacturing a quartz oscillator and the quartz oscillator, and more particularly to a method for manufacturing a quartz oscillator which can restore temperature drift characteristics deteriorated by the removal, by re-etching a quartz oscillating piece mounted in an oscillator package and subjected to partial removal in a state where the quartz oscillating piece is mounted in the oscillator package, and the quartz oscillator.

BACKGROUND ART

An oscillation gyro as one of quartz oscillators is used in a gyroscope of a movable body such as an aircraft or a vehicle, a navigation system of an automobile, a hand movement detection device of a video camera, or the like.

As this oscillation gyro, there is generally a tuning fork type quartz gyro with two or three tines (which will be appropriately abbreviated to as an oscillation gyro).

The tuning fork type quartz gyro with two tines is constituted of a first oscillating body having a driving piezoelectric element provided thereto and a second oscillating body having a detection piezoelectric element provided thereto, and the tuning fork type quartz gyro with three tines is constituted of first and second oscillating bodies each having a driving piezoelectric element provided thereto and a third oscillating body having a detection piezoelectric element provided thereto.

For example, the tuning fork type quartz gyro with two tines excites the oscillating body (a driving leg) having a driving electrode provided thereto to resonate the oscillating body (a detection leg) having a detection electrode provided thereto in the same direction as an exciting direction. When a quartz oscillator configured by accommodating this tuning fork type quartz oscillating piece with two-tines in a package rotates, the oscillating body having the detection electrode provided thereto oscillates in a direction perpendicular to the exciting direction by a Coriolis force received by rotation, and by detecting this oscillation by the detection electrode, an angular speed at which the quartz oscillator rotates can be detected.

Further, since the oscillation gyro integrates the angular speed to calculate a rotation angle, errors in the angular speed are accumulated, and this accumulated error becomes an error in angle. Therefore, in order to improve a measurement accuracy of the oscillation gyro, errors in the angular speed must be reduced.

As a first factor which produces an error in angular speed, there is a processing method of a quartz oscillating piece. In general, as to the quartz oscillating piece, a tabular quartz plate having a corrosion-proof membrane pattern formed thereon is wet-etched to manufacture an oscillating piece having a desired shape matching with the corrosion-proof membrane pattern, but the quartz has an etching anisotropy, processing cannot be performed to obtain a shape equal to the corrosion-proof membrane pattern at the time of wet etching, and an etching residue remains at a part of an etched end surface. In case of the fork quartz oscillator, since this etching residue remains on a side of the oscillating body matching with the exciting direction, the oscillating body is prevented from oscillating in the exciting direction. As a result, in a state where the quartz oscillator is not rotated, the oscillating body does not linearly oscillate in the exciting direction but oscillates in an elliptic trajectory pattern, and hence this oscillation component is detected as oscillation due to the Coriolis force in some cases.

Various technologies which oscillate the oscillating body in one direction have been developed with respect to the above-described factor.

For example, Patent Reference 1 discloses a technology of a characteristic adjustment method of an angular speed sensor which applies an alternating-current voltage to a driving electrode in a first oscillating body or a second oscillating body in a state where an angular speed is not given to the angular speed sensor as an oscillation gyro, and slides a tape in which a polishing agent is embedded on an edge line (a corner portion) in the first oscillating body or the second oscillating body in such a manner that an output signal from a detection electrode at this moment becomes substantially zero, thereby providing a ground portion.

When this technology is used, a ground portion having surface roughness of 2 μm or below can be provided on the edge line of the oscillating body, the balance of each oscillating body can be precisely redressed, and an output signal in a state where no angular speed is given can be approximated to substantially zero.

Moreover, as a second factor which causes an error in an angular speed, there is a change in temperature. Even if the balance of each oscillating body is precisely redressed at a predetermined temperature (which is generally an ordinary temperature) to oscillate each oscillating body in one direction without rotating a quartz oscillator, when a temperature varies, each oscillating body oscillates in an elliptic trajectory pattern, and this oscillation component is detected as oscillation due to a Coriolis force.

It is to be noted that characteristics that an output value varies in accordance with a change in temperature are called temperature drift characteristics, the second factor is the temperature drift characteristics attributed to a quartz oscillating piece, and the temperature drift characteristics must be stabilized. However, a mechanism of occurrence of the temperature drift characteristics has not been technically explained, and a technology of improving the temperature drift characteristics does not exist.

Patent Reference 1: Japanese Patent Application Laid-open No. 2002-243451

DISCLOSURE OF THE INVENTION

However, the technology of the characteristic adjusting method of an angular speed sensor disclosed in Patent Reference 1, i.e., a technology which performs mechanical removal such as polishing with respect to each oscillating body and precisely redress the balance of each oscillating body has a problem that the temperature drift characteristics attributed to the quartz oscillating piece cannot be stabilized.

In order to solve the problem, it is an object of the present invention to provide a method for manufacturing a quartz oscillator which can stabilize temperature drift characteristics attributed to a quartz oscillating piece, and the quartz oscillator.

It is to be noted that the present inventors have keenly worked on study and development in order to improve a measurement accuracy of an oscillation gyro, and have thereby succeeded at technically establishing a method of stabilizing temperature drift characteristics attributed to a quartz oscillating piece.

In order to achieve this object, a method for manufacturing a quartz oscillator of the present invention comprises an outer shape etching step of processing a quartz oscillating piece into a predetermined shape by etching, an electrode forming step of forming an electrode on the quartz oscillating piece processed into the predetermined shape, a mounting step of mounting the quartz oscillating piece having the electrode formed thereon in an oscillator package, a leakage oscillation adjusting step of driving the quartz oscillating piece mounted in the mounting step, detecting the leakage oscillation, and removing a part of the quartz oscillating piece depending on the detected leakage oscillation, and a re-etching step of re-etching the quartz oscillating piece subjected to the removal.

According to this method, temperature drift characteristics attributed to the quart oscillating piece can be stabilized.

Moreover, according to the method for manufacturing a quartz oscillator of the present invention, in the re-etching step, the quartz oscillating piece is dipped together with the oscillator package in an etchant.

Additionally, according to the method for manufacturing a quartz oscillator of the present invention, primary leakage oscillation adjustment which terminates mechanical removal before reaching a target value in prospect of a leakage oscillation adjustment amount in the re-etching step is performed in the leakage oscillation adjusting step, and secondary leakage oscillation adjustment which etches the quartz oscillating piece until the target value is reached is carried out in the re-etching step.

According to this method, the leakage oscillation adjustment can be efficiently performed in the re-etching step, and it is possible to avoid a problem that etching is conducted beyond the target value.

Further, the method for manufacturing a quartz oscillator of the present invention has a small amount removing step of further removing a small amount of the quartz oscillating piece after performing the secondary leakage oscillation adjustment in the re-etching step.

Thus, when a small amount of the quartz oscillating piece is further removed after performing the secondary leakage oscillation adjustment in the re-etching step, the balance of the quartz oscillating piece can be precisely adjusted.

Furthermore, the method for manufacturing a quartz oscillator of the present invention has a cleaning step of cleaning the quartz oscillating piece after performing the small amount removal.

Thus, when the quartz oscillating piece is cleaned after performing the small amount removal, a removal residue generated in the removal can be effectively eliminated.

Moreover, according to the method for manufacturing, a quartz oscillator of the present invention, in the leakage oscillation adjusting step, mechanical removal is carried out with respect to the quartz oscillating piece.

When mechanical removal is effected in this manner, the removing operation can-be efficiently performed.

Additionally, according to the method for manufacturing a quartz oscillator of the present invention, in the leakage oscillation adjusting step, removal using a laser is performed with respect to the quartz oscillating piece.

When the removal is carried out by using a laser in this manner, micro-removal can be effected.

Further, according to the method for manufacturing a quartz oscillator of the present invention, the removal with respect to the quartz oscillating piece in the leakage oscillation adjusting step is performed with respect to a driving leg including a driving electrode of the quartz oscillating piece. In particular, the removal is performed with respect to a corner portion of the driving leg.

When the removal is performed with respect to the driving leg, especially the corner portion thereof in this manner, fine adjustment can be facilitated.

Furthermore, according to the method for manufacturing a quartz oscillator of the present invention, a part of the quartz oscillating piece and the oscillator package is sealed by using a resin, and then dipped in the etchant.

According to this method, these parts can be effectively protected against dipping in the etchant, and hence, for example, it is possible to avoid a problem that these parts are corroded with the etchant.

Moreover, according to the method for manufacturing a quartz oscillator of the present invention, the etchant is hydrofluoric acid or a liquid containing hydrofluorid acid as a main component, and the quartz oscillating piece can be thereby efficiently etched and formed.

Additionally, according to the method for manufacturing a quartz oscillator of the present invention, the liquid containing hydrofluoric acid as the main component is a liquid obtained by mixing ammonium fluoride with hydrofluoric acid, and a capability (an etching rate) of the etchant can be thereby stabilized.

Further, according to the method for manufacturing a quartz oscillator of the present invention, in the mounting step, an adhesive, a wire, an electroconductive adhesive and/or a ball bump are used to mount the quartz oscillating piece in the oscillator package.

According to this method, the quartz oscillating piece can be efficiently mounted in the oscillator package, and it is possible to resist re-etching.

Furthermore, according to the method for manufacturing a quartz oscillator of the present invention, the quartz oscillating piece has a driving leg including a driving electrode and a detection leg including a detection electrode, and the method has a degree of detuning adjusting step of setting a difference between a resonance frequency of the driving leg and a resonance frequency of the detection leg to a predetermined value in the re-etching step. In particular, it is preferable to set a degree of detuning adjusted in the degree of detuning adjusting step to 180±30 Hz or 200±50 Hz.

When the degree of detuning is adjusted in this manner, irregularities in degree of detuning between the quartz oscillating pieces can be reduced, thereby decreasing irregularities in output.

Moreover, according to the present invention, there is provided a quartz oscillator manufactured by using the above method for manufacturing a quartz oscillator. As described above, the present invention is also effective as the quartz oscillator, and can improve temperature drift characteristics of the quartz oscillator.

Additionally, according to the quartz oscillator of the present invention, the quartz oscillator is configured as a gyro, and a measurement accuracy of an angle can be improved when the quartz oscillator is a gyro in this manner.

According to the method for manufacturing a quartz oscillator and the quartz oscillator of the present invention, since an oscillating direction of an oscillating body constituting the quartz oscillating piece can be restricted to one direction, a leakage output when a gyro is adopted can be approximated to substantially zero. Further, temperature drift characteristics attributed to the quartz oscillating piece can be stabilized. Furthermore, adjusting a degree of detuning can reduce irregularities in output.

BEST MODE FOR CARRYING OUT THE INVENTION

Preferred embodiments according to the present invention will now be described in detail hereinafter with reference to the accompanying drawings.

Method for Manufacturing Quartz Oscillator

Figure 1:
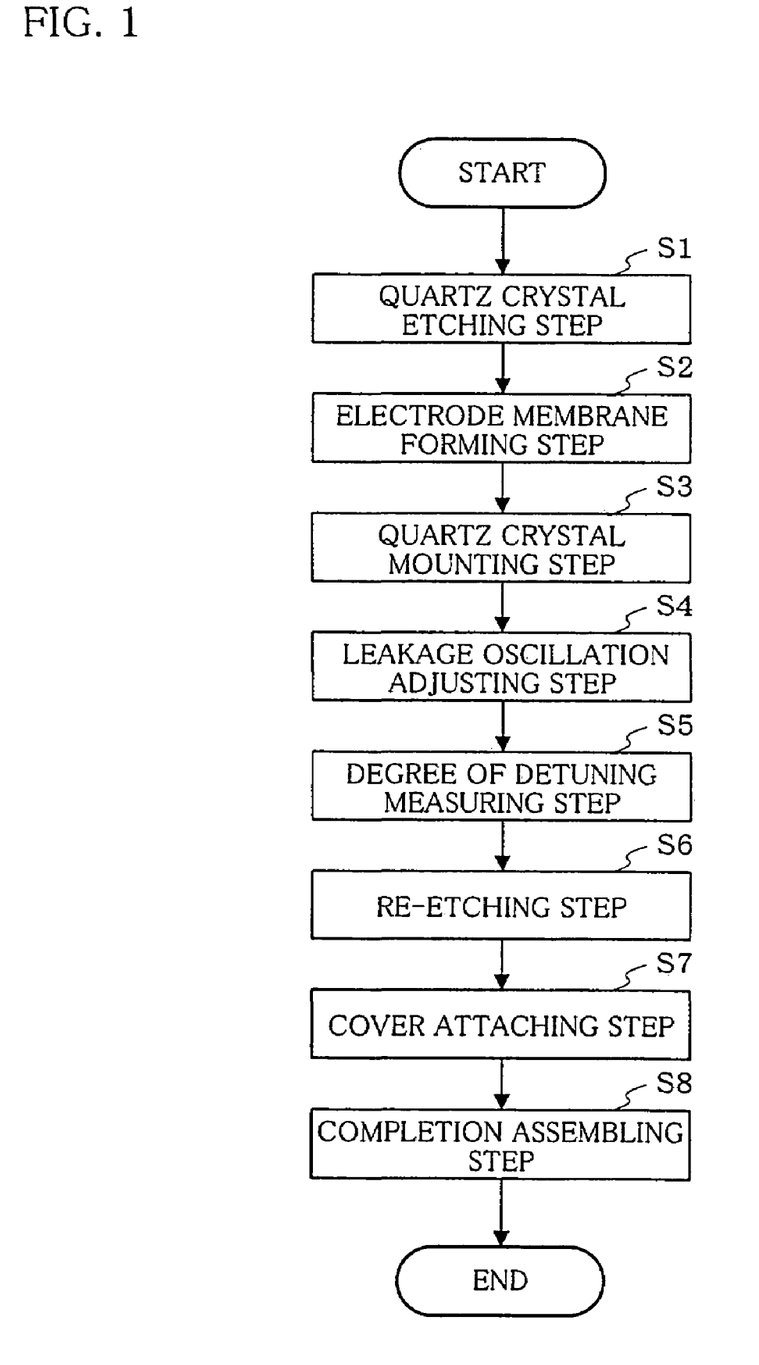
FIG. 1 shows a schematic flowchart illustrating a method for manufacturing a quartz oscillator according to the present invention.

FIG. 1 shows a schematic flowchart illustrating a method for manufacturing a quartz oscillator according to the present invention.

Figure 2:
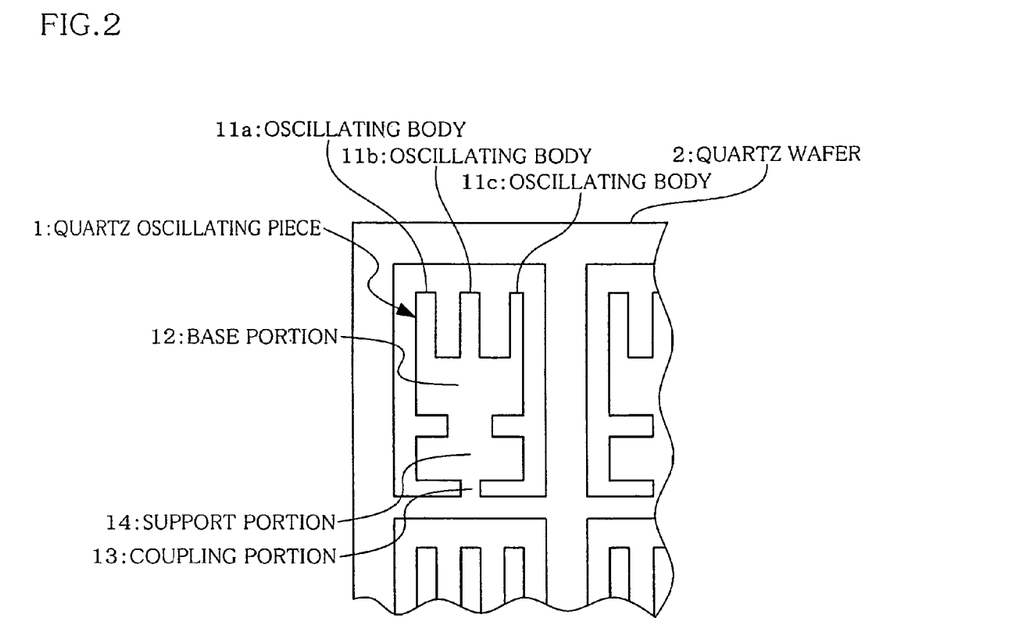
FIG. 2 shows a schematic plan view of a quartz wafer illustrating a quartz crystal etching step in the method for manufacturing a quartz oscillator according to the present invention.

Further, FIG. 2 shows a schematic plan view of a quartz wafer illustrating a quartz crystal etching step in the method for manufacturing a quartz oscillator according to the present invention.

In FIGS. 1 and 2, according to a manufacturing method of an oscillation gyro which is a quartz oscillator, a quartz oscillating piece 1 which is a main component of the oscillation gyro is first manufactured. The plurality of quartz oscillating pieces 1 are manufactured from one quartz wafer 2 in the quartz crystal etching step.

That is, operations such as formation of films of Cr and Au, resist application, mask exposure, development, etching, resist separation and others are carried out with respect to the quartz wafer 2, and a plurality of Cr/Au layers corresponding to an outer shape of the quartz oscillating piece 1 are formed on both surfaces of the quartz wafer 2. Then, an etchant containing hydrofluoric acid as a main component which solves a quartz is used to perform quartz etching, and an element outer shape of each quartz oscillating piece 1 is processed into a predetermined shape (a quartz crystal etching step: a step S1).

In this embodiment, the quartz oscillating piece 1 is a tuning fork type quartz gyro with three-tines, and the predetermined shape of the quartz oscillating piece 1 is as shown in FIG. 2 in which each of three oscillating bodies 11a, 11b and 11c has a square pole shape and a base portion 12 which couples the respective oscillating bodies 11a, 11b and 11c with each other has a rectangular plate shape. Here, the oscillating body 11a is a first oscillating body on which driving electrodes 1D, 1U, 1L and 1R are provided, the oscillating body 11b is a second oscillating body on which driving electrodes 2D, 2U, 2L and 2R are provided, and the oscillating body 11c is a third oscillating body on which detection electrodes 3D and 3U and an earth electrode 3G are provided (see FIG. 3).

Figure 4:
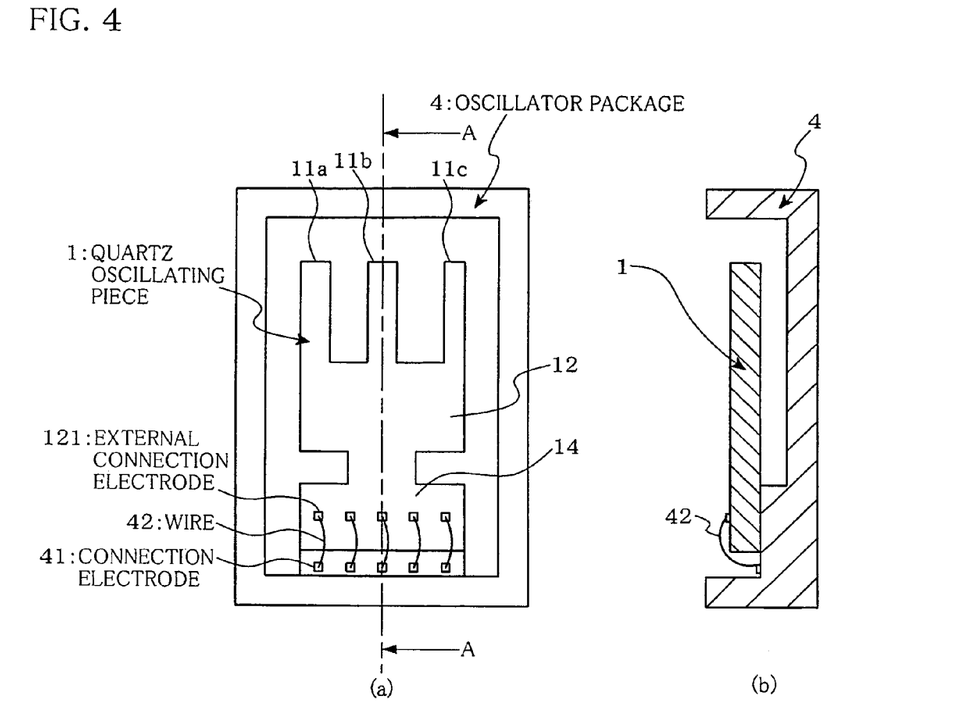
FIG. 4 shows schematic enlarged views of an oscillator package illustrating a quartz crystal mounting step in the method for manufacturing a quartz oscillator according to the present invention, in which (a) shows a plan view and (b) shows a cross-sectional view taken along a line A-A.

Further, a support portion 14 is coupled with the quartz wafer 2 through a coupling portion 13, and external connection electrodes 121 are provided on a surface of the support portion 14 (see FIG. 4).

It is to be noted that, although not shown, when the oscillation gyro is a tuning fork type quartz gyro with two tines, the quartz oscillating piece has a predetermined shape in which each of two oscillating bodies has a square pole shape and a base portion coupling the respective oscillating bodies with each other has a rectangular plate shape.

Then, the Cr/Au layers formed on the upper surface and the lower surface are separated from each quartz oscillating piece 1 subjected to quartz crystal etching, and Cr/Au layers are newly formed on the entire surface of each quartz oscillating piece 1 by vapor deposition or the like.

Subsequently, operations such as resist electrodeposition., exposure, development, Au etching, Cr etching, resist separation and others are carried out to form predetermined electrode membranes with respect to the plurality of quartz oscillating pieces 1 coupled with the quartz wafer 2 (an electrode membrane forming step: a step S2). Then, each quartz oscillating piece 1 is cut out from the quartz wafer.

Figure 3:
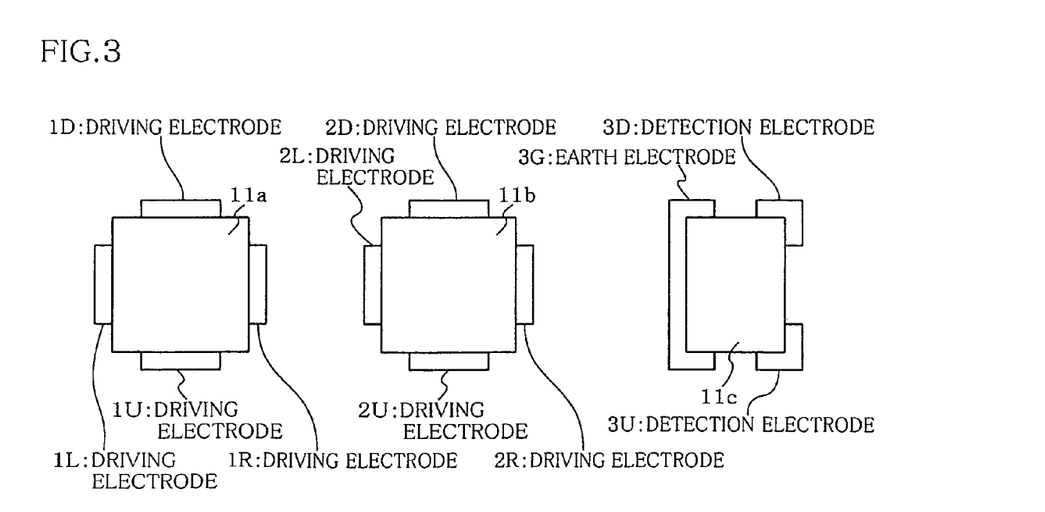
FIG. 3 shows schematic enlarged top views of primary parts illustrating an electrode membrane forming step in the method for manufacturing a quartz oscillator according to the present invention.

FIG. 3 shows schematic enlarged top views of primary parts illustrating the electrode membrane forming step in the method for manufacturing a quartz oscillator according to the present invention.

Referring to the drawing, in the quartz oscillating piece 1, the driving electrodes 1L, 1R, 1D, 1U and 2L, 2R, 2D and 2U are formed on the oscillating bodies (driving legs) 11a and 11b, and the earth electrode 3G and the detection electrodes 3D and 3U are formed on the oscillating body (a detection leg) 11c.

It is to be note that five pads as the external connection electrodes 121 are formed on the quartz oscillating piece 1, the electrodes 1D, 1U, 2L and 2R are connected with a first pad, the electrodes 1L, 1R, 2D and 2U are connected with a second pad, and the earth electrode 3G and the detection electrodes 3D and 3U are respectively connected with dedicated pads.

FIG. 4 is schematic enlarged views of an oscillator package illustrating a quartz mounting step in the method for manufacturing a quartz oscillator according to the present invention, in which (a) shows a plan view and (b) shows a cross-sectional view taken along a line A-A.

In the drawing, the support portion 14 of the quartz oscillating piece 1 is fixed in the oscillator package 4 which can accommodate the quarts oscillating piece 1 therein and has a rectangular box shape by using an adhesive (not shown). Therefore, the respective oscillating bodies 11a, 11b and 11c can oscillate without coming into contact with the oscillator package 4.

Furthermore, the five external connection electrodes 121 arranged on the support portion 14 are respectively connected with five connection electrodes 41 arranged in the oscillator package 4 through wires (Au lines) 42 based on wire bonding (a quartz crystal mounting step: a step S3).

Moreover, the method of mounting the quartz oscillating piece 1 in the oscillator package 4 is not restricted to the above-described method, and the external connection electrodes 121 may be connected and fixed with the connection electrodes 41 by using, e.g., an electroconductive adhesive and/or ball bumps. According to this method, the quartz oscillating piece 1 can be efficiently mounted in the oscillator package 4 and can resist re-etching.

Then, oscillating body characteristics of the oscillating bodies 11a, 11b and 11c are adjusted.

A description will be first given as to a state before adjusting oscillating body characteristics with reference to the drawing.

Figure 5:
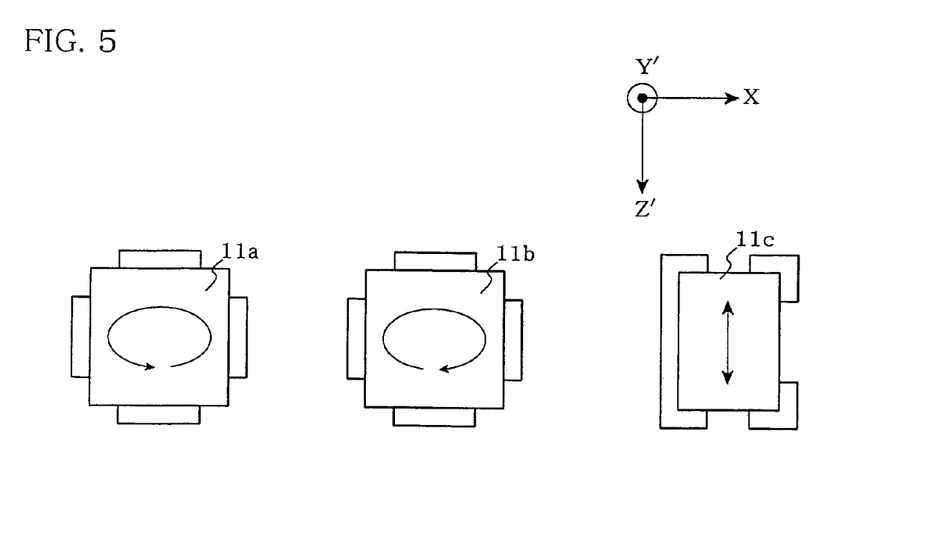
FIG. 5 shows schematic top views of oscillating bodies illustrating a state before performing leakage oscillation adjustment in the method for manufacturing a quartz oscillator according to the present invention.

FIG. 5 shows schematic top views of the oscillating bodies illustrating a state before performing leakage oscillation adjustment in the method for manufacturing a quartz oscillator according to the present invention.

In the drawing, since the quartz oscillating piece 1 in the oscillation gyro requires a structure in which resonance frequencies of driving oscillation and detecting oscillation are approximated to about 300 Hz, detecting oscillation (oscillation in a Z' axis direction) which must not be generated in a state where the quartz oscillating piece 1 is not rotated is produced besides driving oscillation (oscillation in an X axis direction) due to a processing accuracy, a crystal anisotropy of a quartz, etc. Moreover, when detecting oscillation occurs in addition to driving oscillation, a trajectory of an end of each of the oscillating bodies 11a and 11b does not become linear oscillation in the X axis direction, but it becomes oscillation in an elliptic trajectory pattern within a plane parallel with an X-Z' plane. Additionally, a trajectory of an end of the oscillating body 11c becomes linear oscillation in the Z' axis direction. At this time, leakage oscillation (a leakage output) which is irrelevant to a Coriolis output is generated from the detection electrodes 3D and 3U, and this results in a factor of noise or drift.

The oscillation in the elliptic trajectory pattern or the linear oscillation in the Z' axis direction can be corrected by chamfering a part of the quartz oscillating piece 1. For example, when edge lines (corner portions) of one or both of the oscillating bodies (the driving legs) 11a and 11b and the oscillating body (the detection leg) 11c are chamfered and removed, correction can be achieved. In particular, when the corner portions of the oscillating bodies (the driving legs) 11a and 11b are chamfered and removed, correction can be effectively performed.

As to chamfering (removal), it is possible to adopt a mechanical method using a grinding device or the like, an electrical method using a laser or the like, a chemical method using a dissolving agent or the like and others.

A description will now be given as to the mechanical method using a grinding device as an example of the above chamfering with reference to the drawing.

Figure 6:
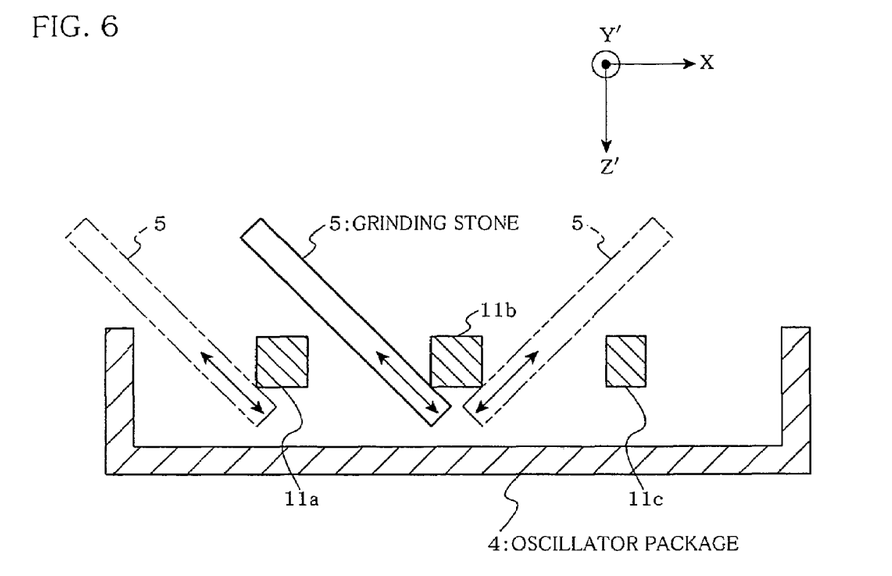
FIG. 6 shows a schematic cross-sectional view of the oscillating bodies illustrating a leakage oscillation adjusting step in the method for manufacturing a quartz oscillator according to the present invention.

FIG. 6 shows a schematic cross-sectional view of the oscillating bodies illustrating a leakage oscillation adjusting step in the method for manufacturing a quartz oscillator according to the present invention.

The mechanical chamfering in the drawing is carried out by, e.g., using a grinding device (not shown) which performs reciprocating oscillation with a tabular grinding stone 5 being cantilevered and supported to monitor an output attributed to an oscillation component in a direction of detecting oscillation (the Z' axis direction) in such a manner that a leakage output becomes small (the leakage oscillation adjusting step: a step S4).

In the leakage oscillation adjusting step, chamfering is gradually performed to avoid excessive grinding, and a chamfering amount (a grinding distance) is compared with a leakage output each time. Therefore, at a final stage of the leakage oscillation adjusting step, it is possible to estimate a last grinding amount to set a leakage output within a target value range.

Here, preferably, it is good enough to terminate the grinding while considering a reduction amount of the leakage output in a later-described re-etching step. According to this method, since a quartz surface roughened by grinding is aboundingly dissolved and chamfered as compared with other surfaces at the time of re-etching, the leakage output can be set to a substantially central value in a target value range.

It is to be noted that, when leakage oscillation adjustment is carried out by using a laser, for example, an edge line (a corner portion) of one of the oscillating bodies 11a and 11b is irradiated with a laser beam from a laser generation device, thereby effecting chamfering. According to the method using a laser, since a small amount can be removed, the balances of the oscillating bodies 11a, 11b and 11c can be precisely adjusted. As a result, it is possible to perform adjustment in such a manner that output signals from the detection electrodes 3D and 3U provided on the oscillating body (the detection leg) 11c become substantially zero in a state where an angular speed is not given.

Then, a degree of detuning is measured (a degree of detuning measuring step: a step S5).

A degree of detuning is defined by a difference between a resonance frequency of driving oscillation and a resonance frequency of detecting oscillation, and it is a factor which determines an output from the oscillation gyro. This degree of detuning is substantially in inverse proportion to an output from the gyro and its slight change greatly varies an output from the gyro, and hence a value of this degree of detuning must be accurately set.

It is to be noted that a resonance frequency of driving oscillation can be measured by using the driving electrodes 1L, 1R, 1D, 1U, 2L, 2R, 2D and 2U shown in FIG. 3 to effect self-excited oscillation of the oscillating bodies 11a and 11b, and a resonance frequency of detecting oscillation can be measured by using the detection electrodes 3D and 3U to effect self-excited oscillation of the oscillating body 11c. Additionally, a degree of detuning can be obtained from a difference between both the resonance frequencies.

Meanwhile, according to current processing accuracy of a quartz crystal, it is difficult to set the degree of detuning in such a manner that temperature characteristics are not deteriorated or a pseudo-output is not generated with respect to oscillation in a smaller range, and it is also difficult to set the degree of detuning to fall within a set value range where a desired output can be demonstrated at the maximum level in a bigger range. Further, if a frequency of driving oscillation alone is adjusted, adjustment can be carried out by a frequency adjusting method or the like which changes a mass of an oscillation leg end portion as used in a general oscillator fork, but this method changes resonance frequencies of both driving oscillation and detecting oscillation by substantially the same amounts, and hence adjusting the degree of detuning is difficult.

However, in reality, the need for adjusting the degree of detuning has been increased for the following reason. That is, irregularities in degree of detuning of a quartz oscillating piece manufactured by a current process correspond to ±80 Hz per wafer (60 quartz oscillating pieces). Furthermore, there are irregularities of ±150 Hz in one lot (30 wafers). When an output may be small, manufacture is possible without adjusting the degree of detuning by increasing the degree of detuning. However, when a large output is required and the degree of detuning should be reduced, the degree of detuning must be adjusted in order to suppress irregularities in output.

Figure 7:
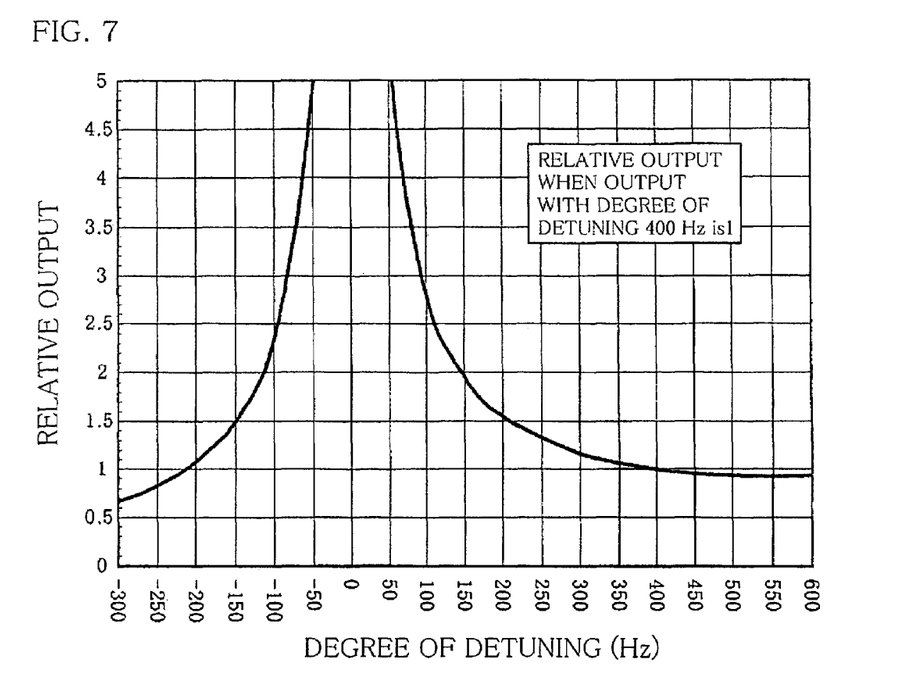
FIG. 7 shows a characteristic view of a degree of detuning and a relative output in the method for manufacturing a quartz oscillator according to the present invention.

Here, an output is increased as an absolute value of the degree of detuning is reduced as shown in FIG. 7, but a change in output with respect to a change in degree of detuning is also increased. Therefore, adjustment must be performed to reduce irregularities in degree of detuning.

As shown in FIG. 7, when a degree of detuning is adjusted, irregularities in degree of detuning can be suppressed to ±30 Hz, whereby a degree of detuning becomes 180±30 Hz and a relative output becomes 1.7±0.2, a high output can be obtained, and irregularities in output can be suppressed to 0.4. Even if a degree of detuning is adjusted to 200±50 Hz, a relative output of 1.6±0.3 can be obtained.

It is to be noted that, when a degree of detuning is not adjusted, an output must be adjusted in irregularities of ±150 Hz as described above, and hence a degree of detuning must be set to 400±150 Hz and a relative output must be set to 1.1±0.2 as shown in FIG. 7 in order to suppress irregularities in output to 0.5 or below.

Thus, in this embodiment, a degree of detuning is adjusted. Specifically, in a state where the quartz oscillating piece 1 is mounted in the oscillator package 4, the quartz oscillating piece 1 is re-etched together with the oscillating package 4 (a re-etching step: a step S6), whereby a resonance frequency of detecting oscillation is changed to adjust a degree of detuning and leakage oscillation.

A description will now be given to steps from the leakage oscillation adjusting step (the step S4) to the re-etching step (the step S6) in detail with reference to the drawing.

Figure 8:
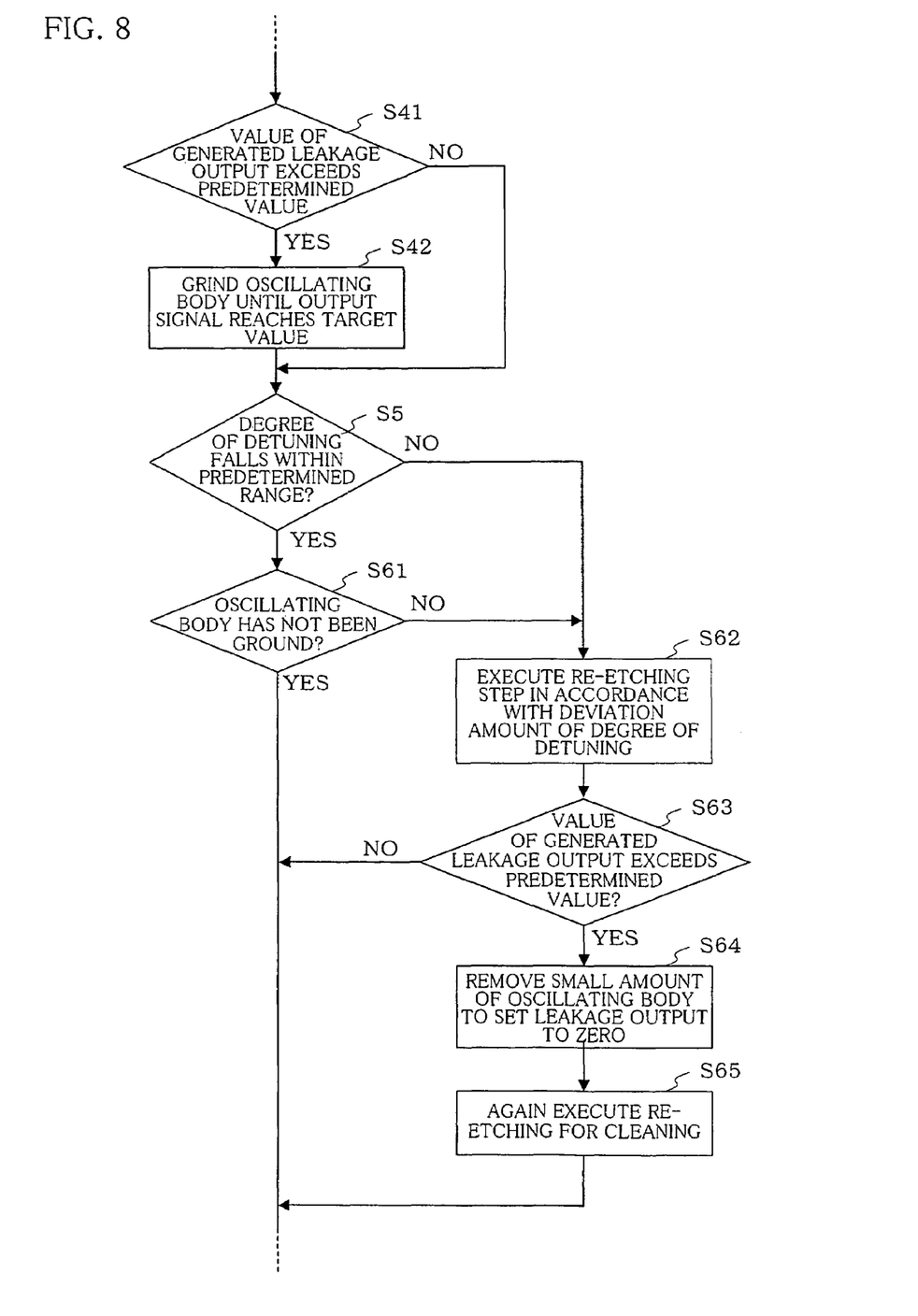
FIG. 8 shows a schematic flowchart illustrating steps from the leakage oscillation adjusting step to a re-etching step in the method for manufacturing a quartz oscillator according to the present invention.

FIG. 8 shows a schematic flowchart illustrating steps from the leakage oscillation adjusting step to the re-etching step in the method for manufacturing a quartz oscillator method according to the present invention.

In the drawing, the oscillator package 4 in which the quartz oscillating piece 1 is mounted is set in a measuring device (not shown) for leakage output measurement, a leakage output generated in a state where an angular speed is not given to the oscillator package 4 is measured, and whether a level of the leakage output exceeds a predetermined value is judged (a step S41).

Moreover, when the level of the leakage output exceeds the predetermined value, edge lines (corner portions) of the oscillating bodies 11a and 11b are ground until the leakage output reaches a target value (a step S42). This target value is appropriately determined while considering a reduction amount of the leakage output by the re-etching step as mentioned above.

Additionally, when the leakage output does not exceed the predetermined value, the processing advances to the above-mentioned degree of detuning measuring step (the step S5).

Then, in the degree of detuning measuring step (the step S5), a resonance frequency of driving oscillation and a resonance frequency of detecting oscillation are respectively measured as described above, and whether a degree of detuning thereof falls within a predetermined range is judged.

Further, the processing advances to a step S61 when the degree of detuning falls within the predetermined range, and the processing proceeds to a step S62 when the degree of detuning does not fall within the predetermined range.

At the step S61, whether the oscillating bodies 11a and 11b have been ground in the step S41 is judged. When the oscillating bodies have not been ground, the measurement and adjustment are all terminated.

Furthermore, at the step S61, even if the degree of detuning falls within the predetermined range, when the oscillating bodies 11a and 11b have been ground, the processing advances to the step S62.

At the step S62, the re-etching step is executed in accordance with a deviation amount of the degree of detuning and a leakage output. That is, when the degree of detuning does not fall within the predetermined range at the step S5, re-etching is carried out until the degree of detuning falls within the predetermined range.

It is to be noted that, since the quartz oscillating piece 1 used for the oscillation gyro is utilized in this embodiment, a high priority is put on the degree of detuning to perform adjustment in this example. For example, when the quartz oscillating piece 1 is a regular oscillator, it is good enough to consider a leakage output alone.

This re-etching is substantially the same as the quartz crystal etching step (the step S1) mentioned above, but the quartz oscillating piece 1 has been already mounted in the oscillator package 4, and hence the quartz oscillating piece 1 is re-etched together with the oscillator package 4.

Here, since a quartz element part on which each electrode is not formed is corroded with an etchant and an etching rate in the Z' axis direction (see FIG. 5) as a quartz thickness direction is high while an etching rate in the X axis direction is lower, adjustment can be performed in such a manner that a resonance frequency of detecting oscillation alone which has an oscillating direction in the Z' axis direction is reduced without substantially changing a resonance frequency of driving oscillation which has an oscillating direction in the X axis direction. That is, a difference between the resonance frequency of driving oscillation and the resonance frequency of detecting oscillation can be adjusted in this re-etching time.

It is to be noted that the oscillator package 4 is constituted of a ceramic package, but the re-etching time is not very long, and hence there is almost no damage due to the etchant.

Further, at the step S62, the quartz surface which has become a rough surface by the removal can be corroded to be smoothened by re-etching. When the quartz surface of the quartz oscillating piece 1 becomes rough by the removal, the frequency-temperature characteristics may be deteriorated, but corroding and smoothening the rough surface by this re-etching can reduce a leakage output and, restore the deteriorated frequency-temperature characteristics of the quartz oscillating piece 1.

Additionally, at the step S62, even if a degree of detuning falls within the predetermined range in the degree of detuning measuring step (the step S5), the oscillating bodies 11a and 11b subjected to grinding are re-etched. That is because frequency-temperature characteristics of the quartz oscillating piece 1 are affected when the quartz surface subjected to removal is a rough surface, and hence performing re-etching in such a manner that a degree of detuning and a leakage output are not changed can smoothen the removed surface, thereby restoring the frequency-temperature characteristics.

Then, the oscillator package 4 having the re-etched quartz oscillating piece 1 is again set in the measuring device (not shown) for leakage output measurement. Further, a secondary leakage output generated in a state where an angular speed is not given to the oscillator package 4 is measured, and whether a value of the generated secondary leakage output exceeds a predetermined value (a step S63).

Here, there is no very large deviation since the leakage output is adjusted to the predetermined value, but, if the leakage output exceeds the predetermined value, the edge lines (the corner portions) of the oscillating bodies 11a and 11b are removed until the leakage output becomes zero at a step S64. It is to be noted that, when the leakage output does not exceed the predetermined value, the measurement and adjustment are all terminated.

It is to be noted that the secondary leakage oscillation adjustment is carried out by, e.g., irradiating the edge line (the corner portion) of one of the oscillating bodies 11a and 11b with a laser beam from the laser generation device to remove a small mount thereof (chamfering). In the secondary leakage oscillation adjustment, using the laser can readily remove a small amount, and hence the balances of the oscillating bodies 11a, 11b and 11c can be precisely adjusted. As a result, it is possible to perform adjustment in such a manner that output signals from the detection electrodes 3D and 3U provided on the oscillating body (the detection leg) 11c become substantially zero in a state where an angular speed is not given.

Then, re-etching is again performed with respect to the quartz oscillating piece 1 subjected to small amount removal at the step S64, for a predetermined short time in order to clean the quartz surface (a step S65).

This step S65 has an effect in removing a removal residue. It is to be noted that this second re-etching can be eliminated as required. Then, the re-etching step is terminated.

EXPERIMENTAL EXAMPLE

An experimental example of the re-etching will now be described with reference to the accompanying drawings.

Figure 10:
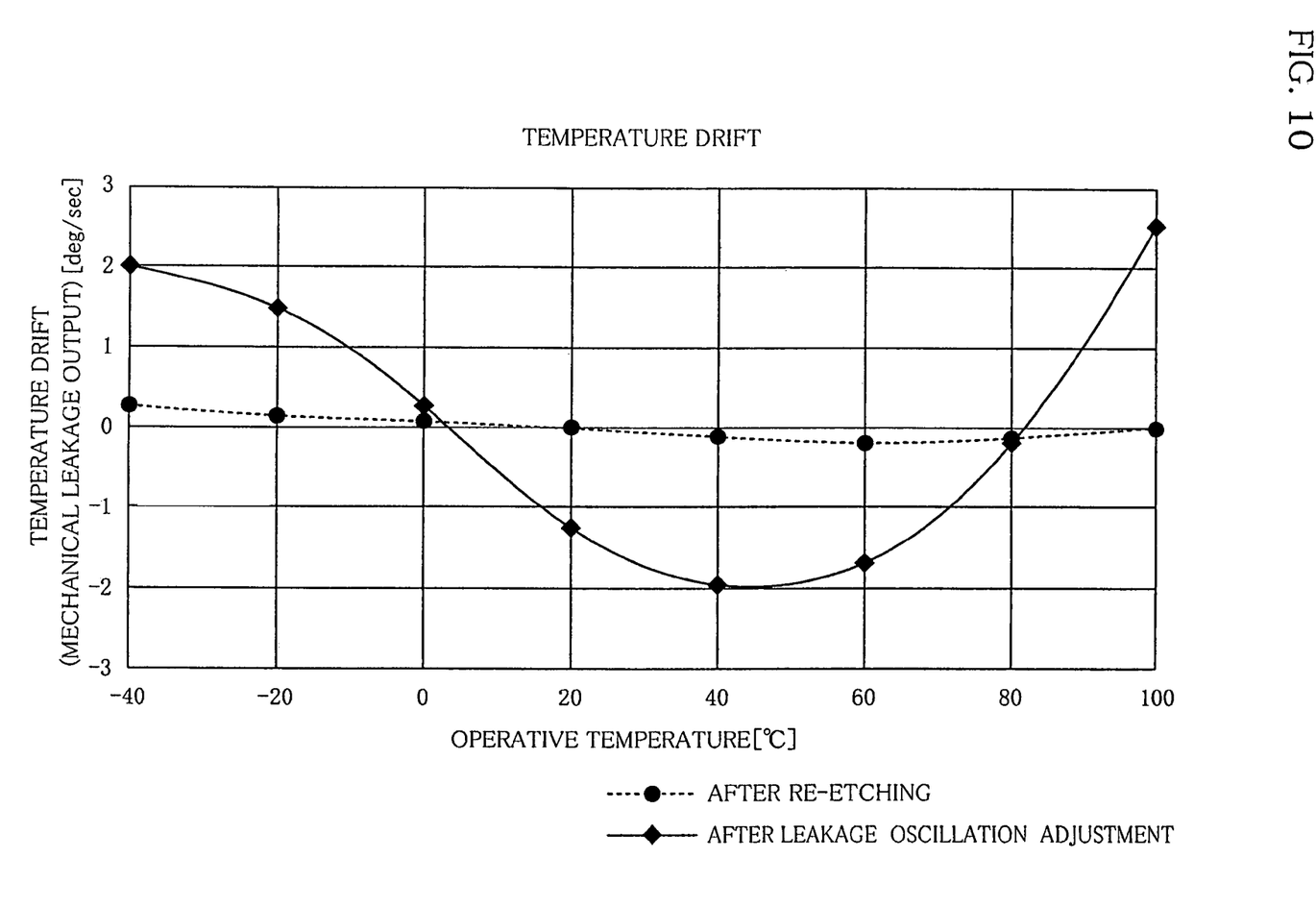
FIG. 10 is a view showing a temperature drift curve illustrating an effect of re-etching with respect to temperature drift characteristics in the the method for manufacturing a quartz oscillator according to the present invention.

FIG. 10 is a view showing a temperature drift curve illustrating an effect of re-etching on temperature drift characteristics in the method for manufacturing a quartz oscillator according to the present invention.

In the drawing, in the oscillation gyro which is not subjected to re-etching, a leakage output was approximately −1.2 deg/sec at approximately 20° C., but the leakage output was changed in a range of approximately 2.5 deg/sec to −2 deg/sec and a temperature drift of approximately 4.5 deg/sec occurred when a temperature was changed in a range of −40° C. to 100° C.

On the contrary, the oscillation gyro was re-etched for approximately 60 seconds, and the same items were measured. In the re-etched oscillation gyro, a leakage output was approximately 0 deg/sec at about 20° C., but the leakage output varied in a range of approximately −0.1 deg/sec to 0.2 deg/sec and a temperature drift of approximately 0.3 deg/sec occurred when a temperature was changed in a range of −40° C. to 100° C. That is, the temperature drift characteristics were greatly improved. As a result, in the oscillation gyro, a measurement accuracy can be largely improved.

It is to be noted that, in the oscillation gyro subjected to re-etching while changing conditions of re-etching or performing fine adjustment, a leakage output was able to be adjusted to approximately 0 deg/sec at about 20° C.

Here, an example of conditions in the re-etching step is as follows.

Etchant
A mixture liquid containing 50% of hydrofluoric acid and 40% of ammonium fluoride at a ratio of 1:1.

Etching Temperature
55° C.
Etching Time
30 to 250 seconds

As shown in FIG. 10, when re-etching is executed after performing removal of the oscillating bodies 11a and 11b in the leakage adjusting step, a temperature drift (a leakage output) can be adjusted to approximately 0 deg/sec. At this time, in order to set this temperature drift (the leakage output) to approximately 0 deg/sec, an etching time must be not smaller than 30 seconds. If the etching time is less than 30 seconds, the temperature drift cannot be eliminated.

Figure 9:
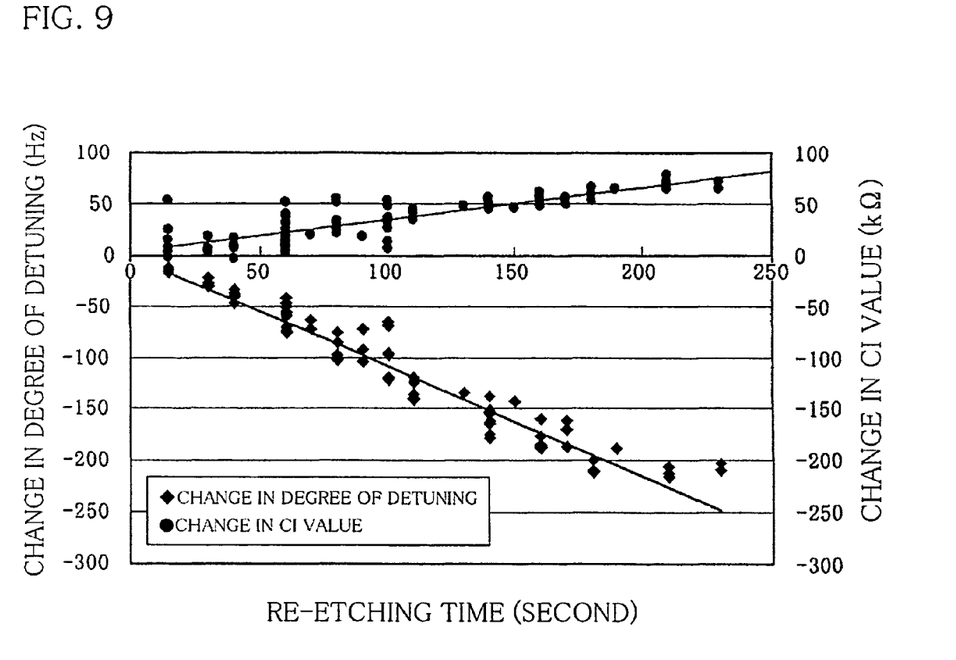
FIG. 9 shows a characteristic view of a change in degree of detuning and a change in CI value with respect to a re-etching time in the method for manufacturing a quartz oscillator according to the present invention.

Further, as shown in the characteristic view of FIG. 9, it can be understood that prolonging the etching time increases a CI value (an equivalent series resistance value). When the CI value is too high, an oscillation amount (an amplitude) of the oscillating body is reduced, whereby an output value is decreased to lower an S/N ratio. Thus, the etching time becomes not greater than 250 seconds considering a range of the CI value which avoids deterioration in the CI value. In this viewpoint, it is preferable to set the re-etching time from 30 to 250 seconds.

It is to be noted that a degree of detuning varies depending on each quartz oscillating piece, and hence a re-etching time must be individually determined in accordance with a degree of detuning adjustment amount each time when adjusting the degree of detuning to a target value. At this time, as shown in FIG. 9, the degree of detuning is approximately 1 Hz reduced per second of the re-etching time, thereby readily obtaining the etching time.

Moreover, in this embodiment, although the oscillator package 4 is dipped in the etchant together with the quartz oscillating-piece 1, if the oscillator package 4 or the like has a part which is not suitable-for dipping in the etchant, it is good enough to seal this part with a resin and then perform re-etching. According to this method, this part can be effectively protected against dipping in the etchant, and hence it is possible to avoid a problem that this part is corroded with the etchant, for example.

Then, the quartz oscillating piece 1 is accommodated in the oscillator package 4 in a vacuumed state, and a cover is attached (a cover attaching step: a step S7).

Subsequently, although not shown, the oscillator package is jointed with a substrate on which electronic components such as an IC are mounted in an IC mounting step, and the oscillation gyro is manufactured through a completion assembling step (a step S8).

As described above, according to the method for manufacturing a quartz oscillator of this embodiment, temperature drift characteristics deteriorated due to grinding in the leakage oscillation adjusting step can be improved by re-etching, and a measurement accuracy of the oscillation gyro can be improved.

Additionally, the present invention is also effective as the invention of the quartz oscillator, and the temperature drift characteristics can be greatly improved in the oscillation gyro smoothly formed by re-etching the surface of the quartz oscillating piece 1.

Further, when the quartz oscillator having the temperature drift characteristics improved by re-etching is configured as a gyro, a measurement accuracy of the oscillation gyro can be largely improved.

Although the above has described the preferred embodiments of the quartz oscillator manufacturing method and the quartz oscillator according to the present invention, the quartz oscillator manufacturing method and the quartz oscillator according to the present invention are not restricted to the foregoing embodiments, and it is needless to say that various modifications can be carried out within the scope of the present invention.

INDUSTRIAL APPLICABILITY

The quartz oscillator manufacturing method and the quartz oscillator according to the present invention are not restricted to an oscillation gyro, and the present invention can be applied as an apparatus using a quartz oscillator and a manufacturing method thereof.

The invention claimed is:

1. A method for manufacturing a quartz oscillator characterized by having:
    an outer shape etching step of processing a quartz oscillating piece into a predetermined shape by etching;
    an electrode forming step of forming an electrode on the quartz oscillating piece processed into the predetermined shape;
    a mounting step of mounting the quartz oscillating piece having the electrode formed thereon in an oscillator package;
    a leakage oscillation adjusting step of driving the quartz oscillating piece mounted in the mounting step, detecting the leakage oscillation, and removing a part of the quartz oscillating piece depending on the detected leakage oscillation; and
    re-etching step of re-etching the quartz oscillating piece subjected to the removal.

2. The method for manufacturing a quartz oscillator according to claim 1, characterized in that, in the re-etching step, the quartz oscillating piece is dipped in an etchant together with the oscillator package.

3. The method for manufacturing a quartz oscillator according to claim 1, characterized in that primary leakage oscillation adjustment which terminates mechanical removal before reaching a target value in prospect of a leakage oscillation adjustment amount in the re-etching step is carried out in the leakage oscillation adjusting step, and secondary leakage oscillation adjustment which etches the quartz oscillating piece until the target value is reached is performed in the re-etching step.

4. The method for manufacturing a quartz oscillator according to claim 3, characterized by having a small amount removing step of further removing a small amount of the quartz oscillating piece after performing the secondary leakage oscillation adjustment in the re-etching step.

5. The method for manufacturing a quartz oscillator according to claim 4, characterized by having a cleaning step of cleaning the quartz oscillating piece after performing the small amount removal.

6. The method for manufacturing a quartz oscillator according to claim 1, characterized in that mechanical removal is performed with respect to the quartz oscillating piece in the leakage oscillation adjusting step.

7. The method for manufacturing a quartz oscillator according to claim 1, characterized in that removal using a laser is performed with respect to the quartz oscillating piece in the leakage oscillation adjusting step.

8. The method for manufacturing a quartz oscillator according to claim 1, characterized in that the removal with respect to the quartz oscillating piece in the leakage oscillation adjusting step is carried out to a driving leg including a driving electrode of the quartz oscillating piece.

9. The method for manufacturing a quartz oscillator according to claim 8, characterized in that the removal is carried out to a corner portion of the driving leg.

10. The method for manufacturing a quartz oscillator according to claim 2, characterized in that a part of the quartz oscillating piece and the oscillator package is sealed with a resin and then dipped in the etchant.

11. The method for manufacturing a quartz oscillator according to claim 2, characterized in that the etchant is hydrofluoric acid or a liquid containing hydrofluoric acid as a main component.

12. The manufacturing method of a quartz oscillator according to claim 11, characterized in that the liquid containing hydrofluoric acid as the main component is a liquid obtained by mixing ammonium fluoride with hydrofluoric acid.

13. The method for manufacturing a quartz oscillator according to claim 1, characterized in that the quartz oscillating piece is mounted in the oscillator package by using an adhesive, a wire, an electroconductive adhesive and/or a ball bump in the mounting step.

14. The method for manufacturing a quartz oscillator according to claim 1, characterized in that the quartz oscillating piece has a driving leg including a driving electrode and a detection leg including a detection electrode, and
    the method has a degree of detuning adjusting step of setting a difference between a resonance frequency of the driving leg and a resonance frequency of the detection leg to a predetermined value in the re-etching step.

15. The method for manufacturing a quartz oscillator according to claim 14, characterized in that a degree of detuning adjusted in the degree of detuning adjusting step is 180±30 Hz or 200±50 Hz.

16. A quartz oscillator characterized by being manufactured by using the method for manufacturing a quartz oscillator according to claim 1.

17. The quartz oscillator according to claim 16, characterized in that the quartz oscillator is a gyro.

* * * * *